United States Patent

McMillan, II et al.

Patent Number: 5,878,487
Date of Patent: Mar. 9, 1999

[54] METHOD OF SUPPORTING AN ELECTRICAL CIRCUIT ON AN ELECTRICALLY INSULATIVE BASE SUBSTRATE

[75] Inventors: Richard Keith McMillan, II, Dearborn; Andrew Zachary Glovatsky, Ypsilanti; Michael George Todd, South Lyon, all of Mich.

[73] Assignee: Ford Motor Company, Dearborn, Mich.

[21] Appl. No.: 718,166

[22] Filed: Sep. 19, 1996

[51] Int. Cl.⁶ .................................................. H01K 3/10
[52] U.S. Cl. ................................ 29/852; 29/830; 29/846
[58] Field of Search ............................. 29/852, 825, 830, 29/846

[56] References Cited

U.S. PATENT DOCUMENTS

| | | | |
|---|---|---|---|
| 3,024,151 | 3/1962 | Robinson | 156/150 |
| 3,214,315 | 10/1965 | Hildebrand | 156/222 |
| 3,374,110 | 3/1968 | Miller . | |
| 3,462,832 | 8/1969 | Kubik | 29/852 |
| 4,211,603 | 7/1980 | Reed | 29/852 X |
| 4,325,780 | 4/1982 | Schulz, Sr. | 29/852 X |
| 4,495,232 | 1/1985 | Bauser et al. | 428/41 |
| 4,512,829 | 4/1985 | Ohta et al. | 29/852 X |
| 4,735,676 | 4/1988 | Iwasa | 29/852 X |
| 4,790,902 | 12/1988 | Wada et al. | 156/630 |
| 4,870,751 | 10/1989 | Antoon | 29/846 |
| 4,983,246 | 1/1991 | Bunting | 156/240 |
| 4,985,116 | 1/1991 | Mettler et al. | 156/656 |
| 5,045,141 | 9/1991 | Salensky et al. | 156/240 |
| 5,047,114 | 9/1991 | Frisch et al. | 156/630 |
| 5,063,658 | 11/1991 | Wild | 29/846 |
| 5,153,987 | 10/1992 | Takahashi et al. | 29/852 |
| 5,421,082 | 6/1995 | Errichiello | 29/846 |
| 5,502,893 | 4/1996 | Endoh et al. | 29/852 |
| 5,504,992 | 4/1996 | Fukutomi et al. | 29/852 X |

FOREIGN PATENT DOCUMENTS

| | | | |
|---|---|---|---|
| 1-99288 | 4/1989 | Japan | 29/852 |
| 5-55750 | 3/1993 | Japan | 29/852 |

*Primary Examiner*—Carl J. Arbes
*Attorney, Agent, or Firm*—Leslie C. Hodges; Roger L. May

[57] ABSTRACT

A method of supporting an electrical circuit on an electrically insulative base substrate comprises embossing a first circuit pattern on the substrate, and plating or etching a second circuit pattern over the first circuit pattern such that the first and second circuit patterns are in physical contact with each other for electrical communication therebetween. Plated through-holes are provided for facilitating support of a twisted pair of electrical conductors on a base substrate.

11 Claims, 5 Drawing Sheets

METHOD OF SUPPORTING AN ELECTRICAL CIRCUIT ON AN ELECTRICALLY INSULATIVE BASE SUBSTRATE

TECHNICAL FIELD

The present invention relates to a method of supporting electrical circuitry and, more particularly, to a method of supporting such circuitry on an electrically insulative base substrate.

BACKGROUND OF THE INVENTION

Typically, in vehicle instrument panel applications, wiring harnesses or wire bundles run into and out of metal boxes which support electronic devices. The metal box is typically mounted to a support structure beneath the instrument panel and supported in an appropriate position, preferably behind the center stack bezel of the instrument panel for providing electronic support to the vehicle temperature control and sound system, as well as other electronic instrument panel components, such as the anti-lock brake module, engine control module, air bag module, etc.

This assembly can consume a substantial amount of space beneath the instrument panel. The bulky metal box with bundles of wires extending therefrom will have substantial space requirements, and will adversely affect packaging design efficiency in a vehicle. Furthermore, the metal box increases manufacturing costs and vehicle weight.

U.S. patent application Ser. No. 08/642,723, filed May 3, 1996, and assigned to the assignee of the present application, discloses an apparatus and method of assembling vehicle instrument panel structural and electronic components which comprises applying a conductive pattern directly to a base substrate. The application discloses various methods of applying the conductive pattern to the base substrate, including electroplating, embossing, ultrasonic embedding, etc. Embossing may be used for applying a circuit with high current-carrying capacity, while electroplating or subtractive etching may be used for applying fine line circuitry to the base substrate. No known methods are currently available which provide both fine line and high current-carrying capability in a complex circuit pattern.

It is desirable to provide electrical circuitry directly onto a base substrate in complex circuit pattern configurations with both fine line and high current-carrying capability.

DISCLOSURE OF THE INVENTION

The present invention overcomes the abovereferenced shortcomings of prior art methods by providing a method of supporting an electrical circuit on an electrically insulative base substrate, comprising: 1) embossing a first circuit pattern on the substrate; and 2) plating or subtractively etching a second circuit pattern over the first circuit pattern such that the first and second circuit patterns are in physical contact with each other for electrical communication therebetween.

In another embodiment, the present invention provides a method of supporting a twisted pair of electrical conductors, comprising: 1) embossing circuit patterns on opposing sides of a base substrate, the circuit patterns each comprising a series of spaced apart conductive traces having opposing ends positioned directly opposite opposing ends of corresponding traces on the opposite side of the base substrate, the traces crossing opposing traces on opposing sides of the base substrate; 2) forming holes through the substrate in communication with the opposing ends; and 3) plating the holes to electrically interconnect the opposing ends, thereby forming a twisted pair of electrical conductors.

Accordingly, an object of the present invention is to provide a method of supporting an electrical circuit on an electrically insulative base substrate with both fine line and high current-carrying capability in a substantially complex circuit configuration.

The above object and other objects, features, and advantages of the present invention are readily apparent from the following detailed description of the best modes for carrying out the invention when taken in connection with the accompanying drawings.

BEST MODES FOR CARRYING OUT THE INVENTION

The present invention combines embossing and plating/etching techniques to fabricate a printed circuit substrate which combines the advantages of both substrate constructions. A variety of finished substrate types are possible, depending on the substrate characteristics desired and the processing steps employed.

Figure 1:
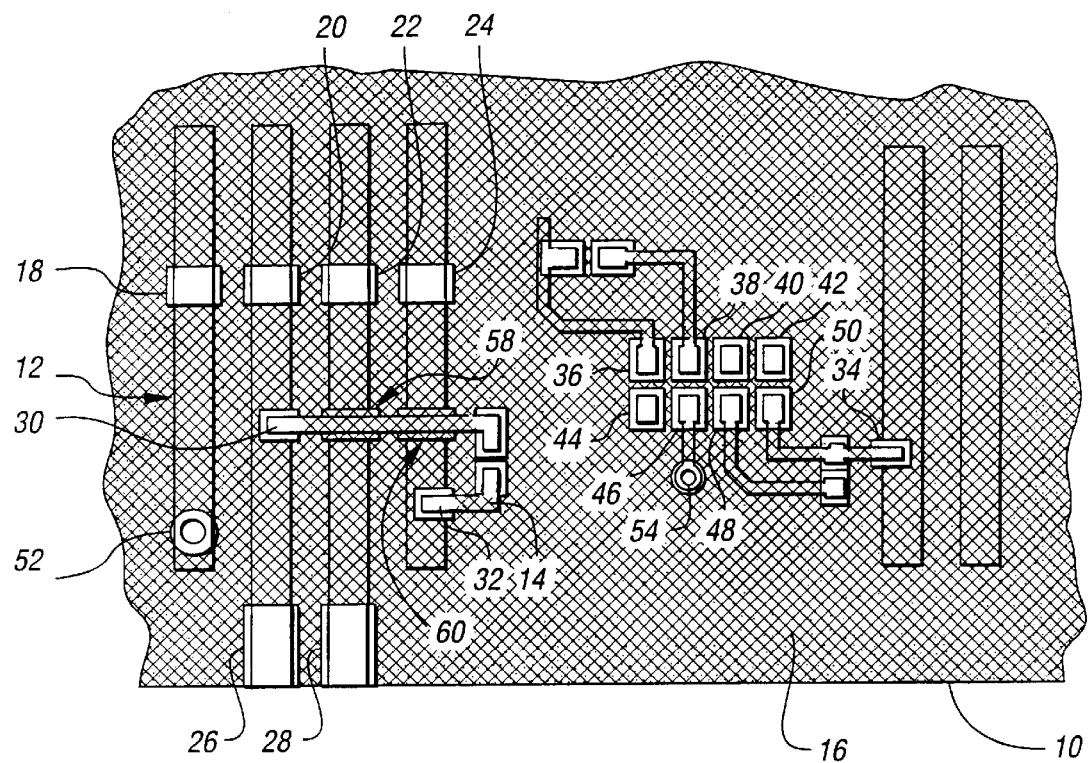
FIG. 1 shows a cut-away plan view of a base substrate supporting an electrical circuit in accordance with the present invention.

As shown in FIG. 1, the present invention comprises a method of supporting an electrical circuit on an electrically insulative base substrate 10 comprising embossing a first circuit pattern 12 onto the base substrate 10, and plating or etching a second circuit pattern 14 over the embossed circuit pattern such that the embossed and plated/etched circuit patterns are in physical contact with each other for electrical communication therebetween. After the two circuit patterns have been applied to the base substrate 10, a solder mask 16 (indicated by cross-hatching in FIG. 1) is applied on top of each to protect the circuits, as well as on top of the substrate. Openings 18, 20, 22, 24 (and others not labeled) are formed in the solder mask for mounting of electronic components thereon. Additionally, integral edge connectors 26, 28 may be formed thereon for connection at the edge of the substrate 10. Plated-to-embossed circuit connections are made at areas 30, 32 and 34. Also, embossed component mounting pads 36, 38, 40, 42 are provided adjacent plated component mounting pads 44, 46, 48, 50 for mounting of electronic devices.

Figure 2:
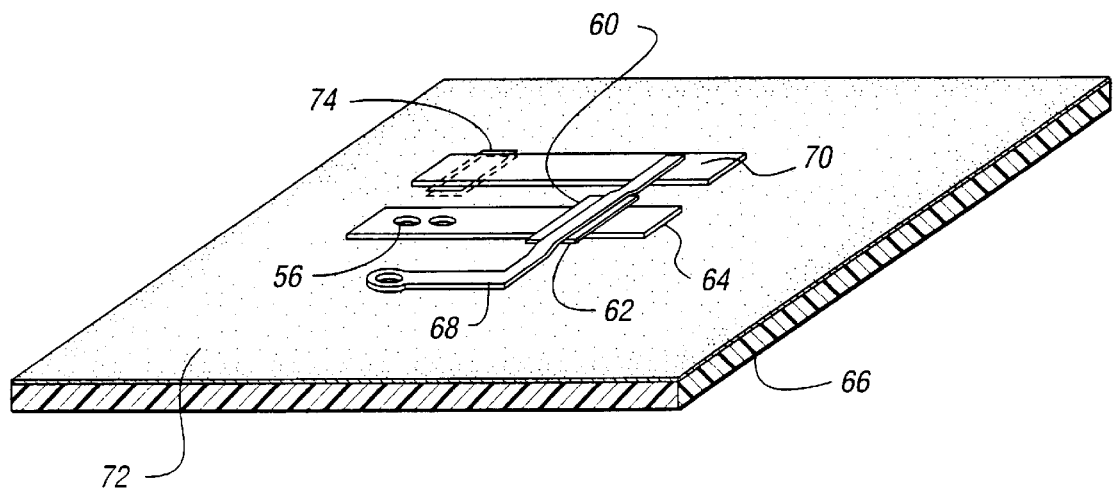
FIG. 2 shows a perspective view of a base substrate supporting an electrical circuit in accordance with an alternative embodiment of the present invention.

Other features illustrated in FIG. 1, and more clearly shown in the alternative embodiment illustrated in FIG. 2, include plated through-holes 52, 54, 56 and embossed-plated circuit crossovers 58, 60. The plated through-holes 52, 54, 56 are used to interconnect circuits disposed on opposing sides of the base substrate 10. A hole is formed in communication with the circuitry on the opposing sides of the substrate, and the hole is then plated to electrically interconnect the two circuits. The crossovers 58, 60 are accomplished by providing a plateable dielectric 62 over the embossed circuit 64, which is disposed on the base substrate 66. The plated circuit trace 68 then crosses over the dielectric 62 without forming an electrical contact with the embossed circuit 64. The plated circuit trace 68 then forms a connection with the embossed circuit trace 70. A solder mask or circuit passivation layer 72 is then applied over the circuits 64,68 and an opening 74 is provided in the solder mask 72 for electronic device mounting.

Figure 3:
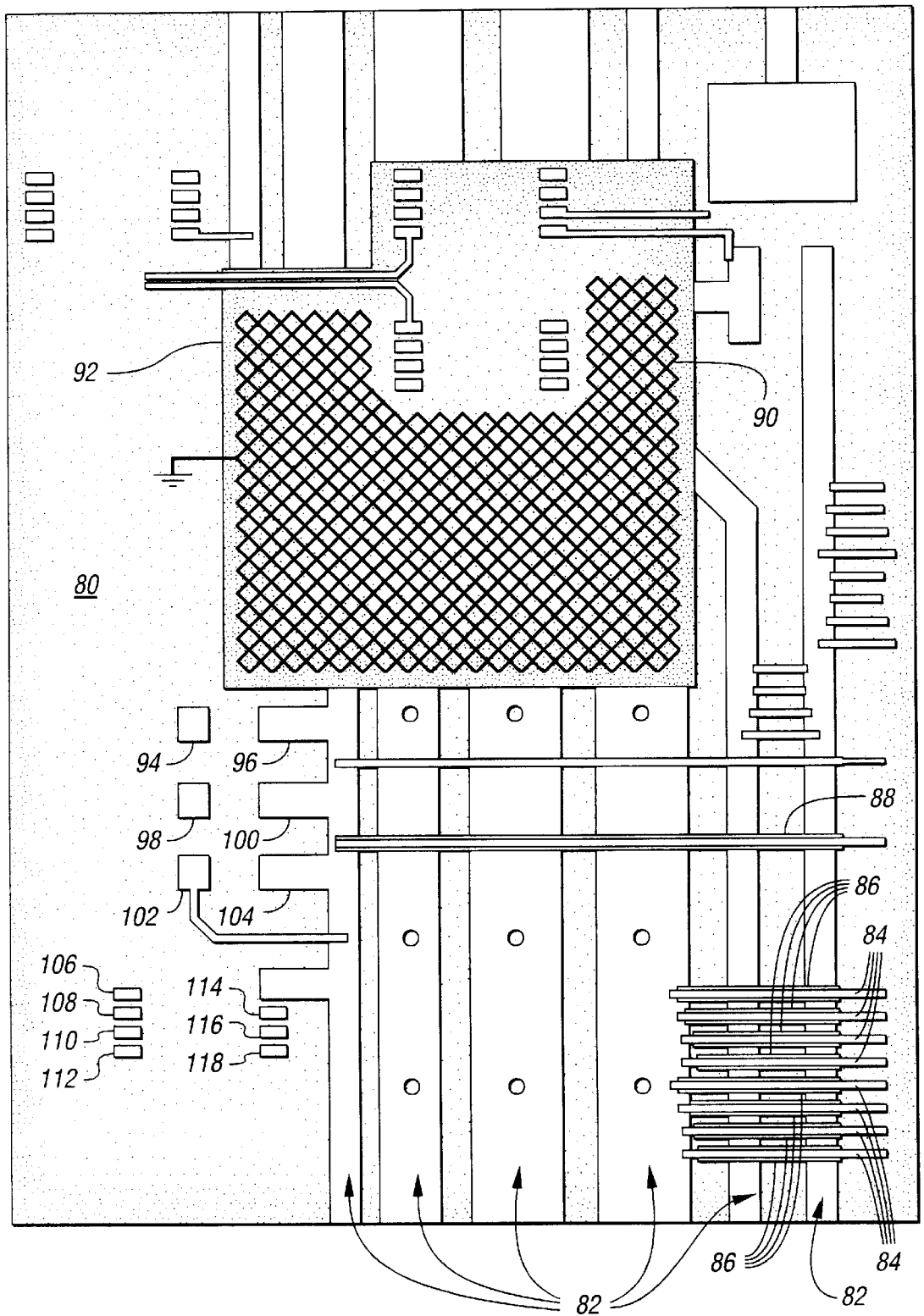
FIG. 3 shows a plan view of a base substrate supporting an electrical circuit in accordance with a second alternative embodiment of the present invention.

FIG. 3 shows a second alternative embodiment which comprises a base substrate 80 having an embossed circuit pattern 82 thereon, and further having a plated circuit pattern 84 disposed over the embossed circuit pattern 82. Various dielectric pads 86, 88 are provided over the embossed pattern 82 to insulate the plated traces 84 therefrom. FIG. 3 also illustrates the use of a plated shielding layer 90 provided on a large dielectric sheet 92 disposed on top of embossed lines 82 for shielding the embossed pattern 82 from electromagnetic interference. Component mounting locations 94, 96, 98, 100, 102, 104, 106, 108, 110, 112, 114, 116, and 118 are provided and consist of both plated and embossed mounting locations, or any combination.

Figure 4:
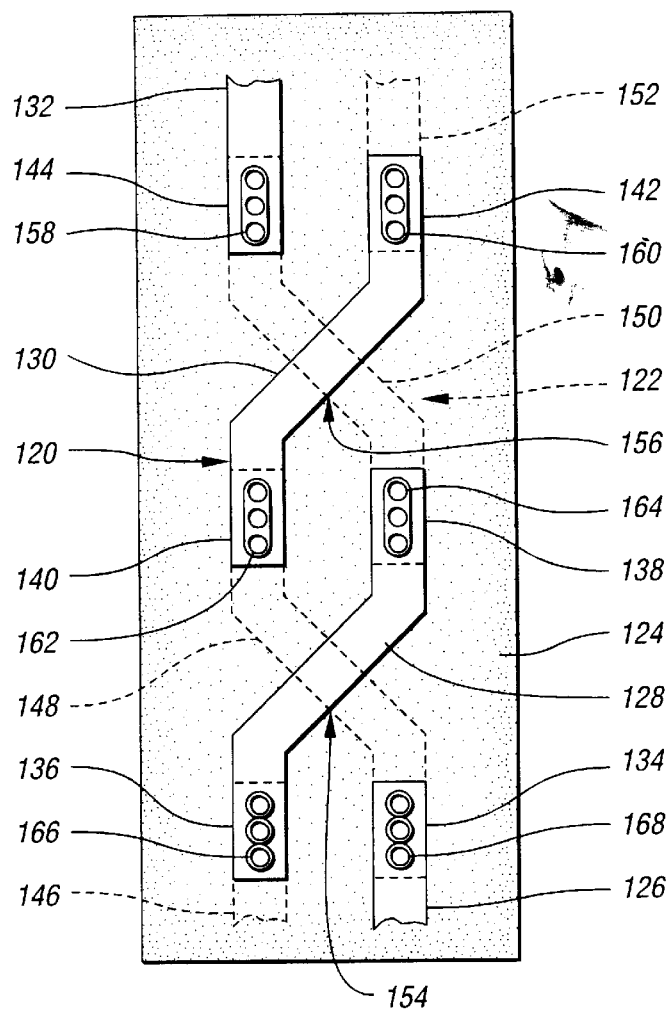
FIG. 4 shows a cut-away plan view of a base substrate supporting a twisted pair of electrical conductors in accordance with a third alternative embodiment of the present invention.

Turning to FIG. 4, an apparatus for supporting a twisted pair of electrical conductors is illustrated. Embossed circuit patterns 120 and 122 are formed on opposing sides of a base substrate 124. The circuit patterns 120, 122 each comprise a series of spaced apart conductive traces 126, 128, 130, 132 having opposing ends 134, 136, 138, 140, 142, 144 positioned directly opposite opposing ends of corresponding traces 146, 148, 150, 152 on the opposite side of the base substrate 124. The respective traces crossover their corresponding opposing trace on the opposite side of the base substrate 124, such as at the crossover locations 154, 156. Holes 158, 160, 162, 164, 166, 168 are then formed through the base substrate 124 in communication with each opposing end 134, 136, 138, 140, 142, 144. The holes 158, 160, 162, 164, 166, 168 are then plated to electrically interconnect the opposing ends, thereby forming a twisted pair of electrical conductors.

Accordingly, the new features of the invention illustrated in FIGS. 1–4 include: plated-to-embossed conductor electrical interconnects on one side of a circuit board substrate; plated crossovers which allow plated conductors to pass over embossed conductors without electrical interconnection; plated through-hole interconnects between embossed conductors on different conductor layers of a substrate; plated through-hole interconnects between plated and embossed conductors on different conductor layers of a substrate; over-plating of embossed conductors to achieve increased conductor thickness (and/or increased conductor current-carrying capability); electronic component mounting/interconnection locations comprising embossed, plated, and/or embossed/plated mounting surfaces; high current capability and fine line conductor geometry within a single electronic substrate; high current embossed conductors arranged in a twisted pair configuration; high current conductor shielding implemented by over-plating an embossed substrate over a dielectric; embossed/plated substrates as described above applied as replacements for vehicle wiring harnesses which may, in addition, include functionality not practical with current wire harness technology; e.g., integral attachment sites for electronic components and/or capability for fabrication as part of other structural/functional vehicle components.

The above new features are obtained using a combination of embossed and plated/etched circuit technologies illustrated in FIGS. 5a–j. The base substrate typically includes at least one surface composed of an appropriate polymer material (either thermoplastic or thermoset), and may be flat or three-dimensional.

Figure 5A:
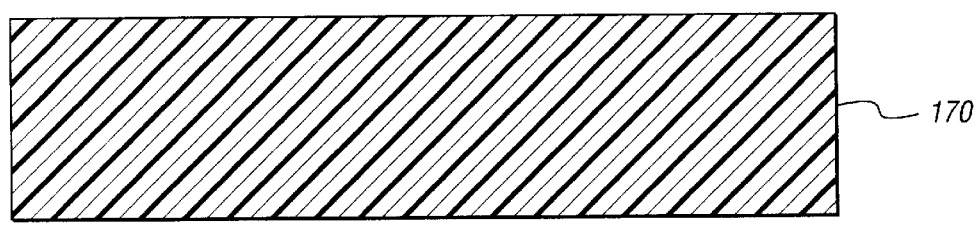
FIGS. 5a–j schematically illustrate the method of embossing and plating/etching (semi-additive process or pattern plating) a base substrate in accordance with the present invention.
Figure 5B:
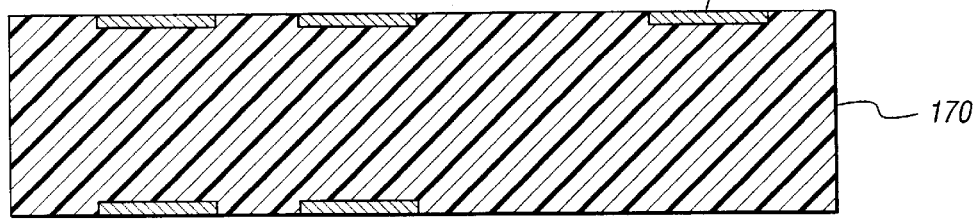
Figure 5C:
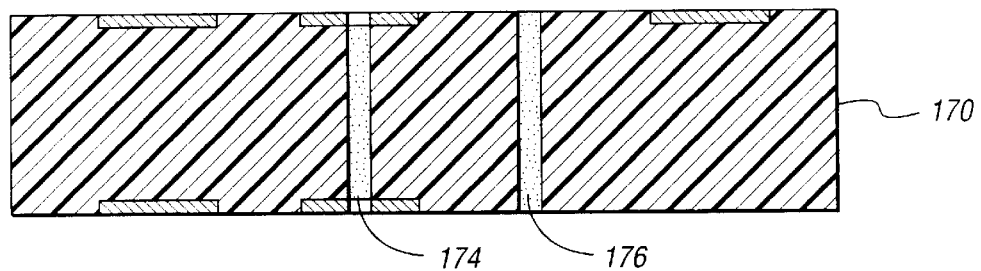
Figure 5D:
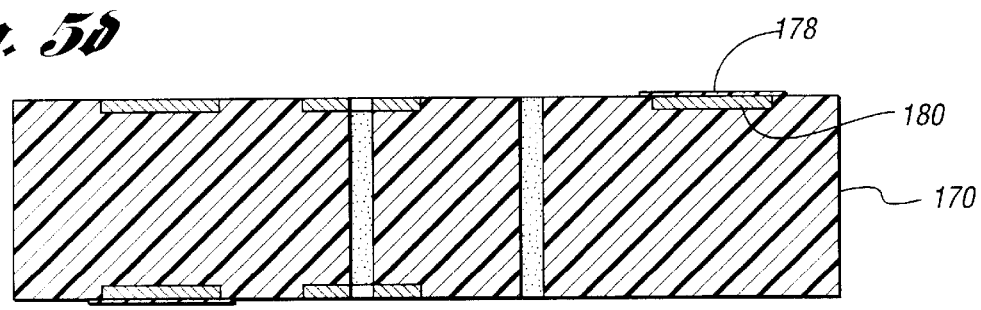
Figure 5E:
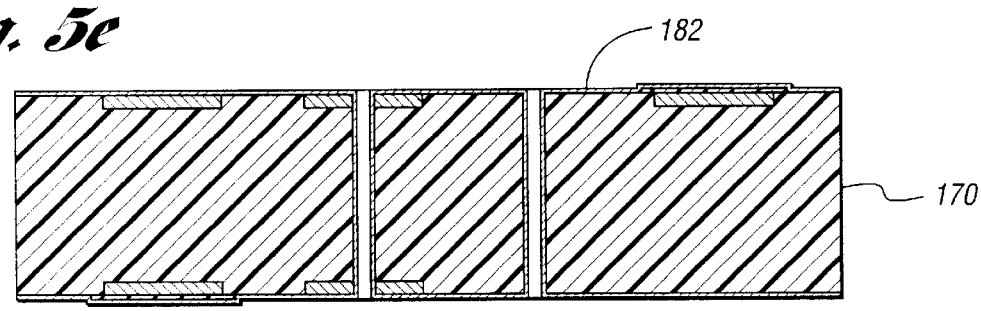
Figure 5F:
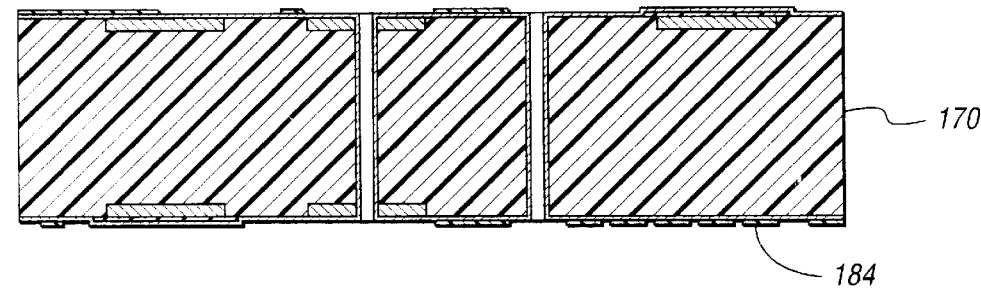
Figure 5G:
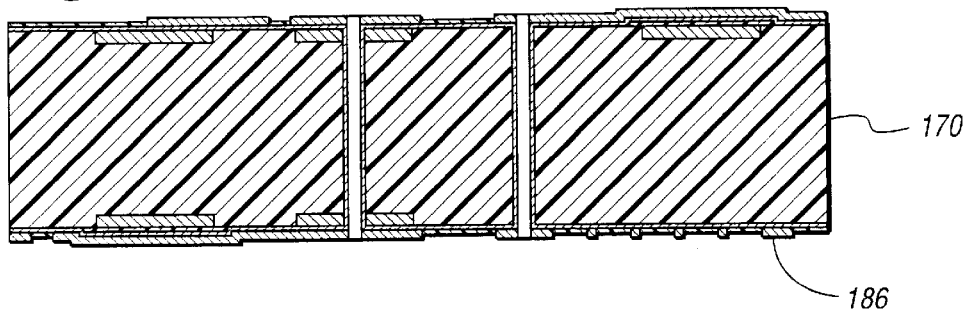

Turning to FIGS. 5a–j, a method of supporting an electrical circuit on an electrically insulative base substrate is illustrated. First, the base substrate 170 is provided as shown in FIG. 5a, and the embossed circuit pattern 172 is then provided on both sides of the base substrate 170 (FIG. 5b). Through-holes 174, 176 are then drilled through the base substrate 170 as shown in FIG. 5c. A dielectric 178 is then applied over an embossed conductor 180, as shown in FIG. 5d, if plated crossovers are desired. Electroless flash copper 182 is then applied on both sides of the base substrate 170 and in the drilled holes 174,176, as illustrated in FIG. 5e. A plating resist 184 is then applied over portions of the flash copper 182, as shown in FIG. 5f. Turning to FIG. 5g, copper 186 is electroplated onto the electroless flash copper 182 in those locations where the plating resist 184 is not present.

Figure 5H:
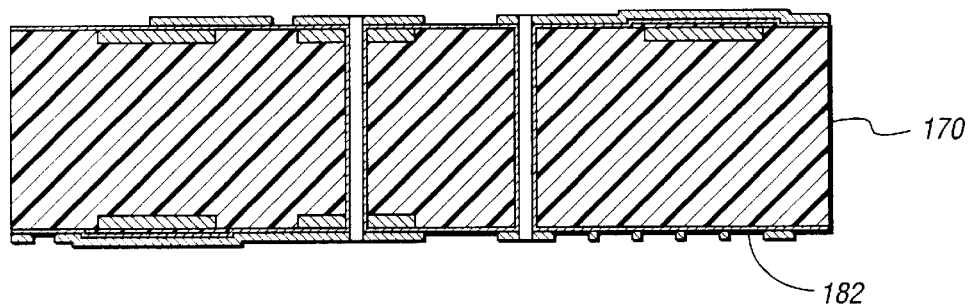
Figure 5I:
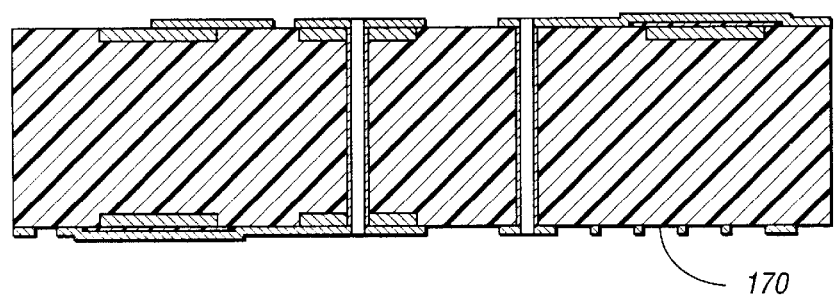
Figure 5J:
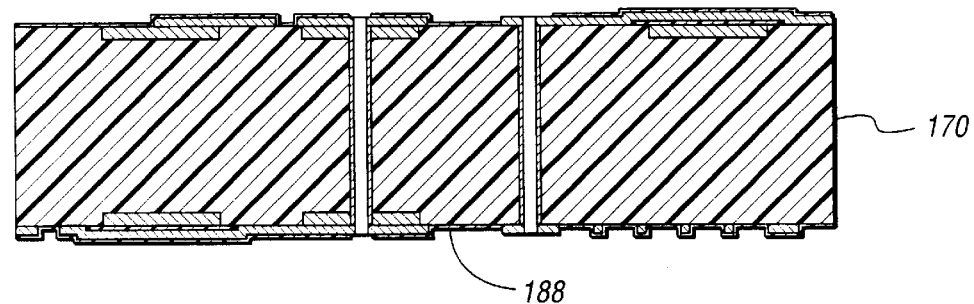

The plating resist 184 is then stripped, as shown in FIG. 5h, to expose the electroless flash copper layer 182. A micro-etching process is then applied to remove the thin/copper layer 182 (see FIG. 5i), thus exposing the substrate 170, and completing the formation of the circuit patterns on opposing sides of the base substrate 170. A passivation layer or solder mask 188 is then applied over the circuit patterns in desired locations to protect the circuit patterns, as shown in FIG. 5j.

Accordingly, new features and advantages of the present invention illustrated herein over the prior technology include:

1. Providing high current/fine line capability in a single flat or 3-D printed circuit substrate;
2. Increasing printed circuit substrate functionality;
3. Enabling integration of electronics with other structural/functional components;
4. Reducing electronics' total manufacturing complexity and cost;
5. Replacing traditional vehicle wiring harnesses;
6. Integrating vehicle wiring harnesses and electronic functions;
7. Reducing vehicle subsystem manufacturing complexity and cost;
8. Improving vehicle space utilization;
9. Increasing electronic circuit integration (shared power supplies, electromagnetic compatibility protection, etc.).

While the best modes for carrying out the invention have been described in detail, those familiar with the art to which this invention relates will recognize various alternative designs and embodiments for practicing the invention within the scope of the appended claims.

What is claimed is:

1. A method of supporting an electrical circuit on an electrically insulative base substrate having opposing surfaces, comprising:

embossing a first circuit pattern on one surface of the substrate; and plating a second circuit pattern over the first circuit pattern on the one surface such that said first and second circuit patterns are in physical contact with each other for electrical communication therebetween.

2. The method of claim 1 further comprising placing a plateable dielectric over at least a portion of said first circuit pattern prior to plating to prevent electrical communication with said second circuit pattern.

3. The method of claim 1 further comprising:

embossing a third circuit pattern on the opposing surface;

forming a hole through the substrate in communication with said first and third circuit patterns; and plating said hole to electrically interconnect said first and third circuit patterns.

4. The method of claim 1 further comprising applying a circuit passivation layer over said first and second circuit patterns.

5. The method of claim 1 wherein said step of plating the second circuit pattern over the first circuit pattern comprises plating a portion of said second circuit pattern directly onto a corresponding portion of said first circuit pattern, whereby to thicken said corresponding portion and increase the current-carrying capacity thereof.

6. A method of supporting an electrical circuit on an electrically insulative base substrate having opposing sides, comprising:

embossing a first circuit pattern on one surface of the base substrate; and etching a second circuit pattern over the first circuit pattern on the one surface such that said first and second circuit patterns are in physical contact with each other at at least one location for electrical communication therebetween.

7. The method of claim 6 further comprising placing a dielectric over at least a portion of said first circuit pattern prior to etching to prevent electrical communication with said second circuit pattern.

8. The method of claim 6 further comprising:

embossing a third circuit pattern on the opposing surface;

forming a hole through the substrate in communication with said first and third circuit patterns; and plating said hole to electrically interconnect said first and third circuit patterns.

9. The method of claim 6 further comprising applying a circuit passivation layer over said first and second circuit patterns.

10. A method of supporting an electrical circuit on an electrically insulative base substrate having opposing surfaces, comprising:

embossing a first circuit pattern on one surface of the substrate;

plating a second circuit pattern over the first circuit pattern on the one surface such that said first and second circuit patterns are in physical contact with each other for electrical communication therebetween; and applying a circuit passivation layer over said first and second circuit patterns.

11. A method of supporting an electrical circuit on an electrically insulative base substrate having opposing surfaces, comprising:

embossing a first circuit pattern on one surface of the base substrate;

etching a second circuit pattern over the first circuit pattern on the one surface such that said first and second circuit patterns are in physical contact with each other at at least one location for electrical communication therebetween; and applying a circuit passivation layer over said first and second circuit patterns.

* * * * *